(12) United States Patent
Chen

(10) Patent No.: US 12,601,355 B2
(45) Date of Patent: Apr. 14, 2026

(54) OUTDOOR EQUIPMENT WITH DETACHABLE FUNCTIONAL COMPONENTS

(71) Applicant: Shenzhen Aikuli Technology Co., Ltd, Shenzhen Guangdong (CN)

(72) Inventor: Miaosheng Chen, Shenzhen Guangdong (CN)

(73) Assignee: Shenzhen Aikuli Technology Co., Ltd, Shenzhen (CN)

( * ) Notice: Subject to any disclaimer, the term of this patent is extended or adjusted under 35 U.S.C. 154(b) by 0 days.

(21) Appl. No.: 19/078,350

(22) Filed: Mar. 13, 2025

(65) Prior Publication Data

US 2026/0036130 A1    Feb. 5, 2026

(30) Foreign Application Priority Data

Aug. 2, 2024    (CN) .......................... 202421860704.1

(51) Int. Cl.
| | |
|---|---|
| *H05K 7/02* | (2006.01) |
| *F04D 25/08* | (2006.01) |
| *F04D 27/00* | (2006.01) |

(52) U.S. Cl.
CPC .......... *F04D 25/08* (2013.01); *F04D 27/004* (2013.01); *H05K 7/02* (2013.01)

(58) Field of Classification Search
None
See application file for complete search history.

(56) References Cited

U.S. PATENT DOCUMENTS

| | | | | |
|---|---|---|---|---|
| 5,570,002 A | * | 10/1996 | Castleman | ................ G06F 1/00 323/283 |
| 11,715,980 B2 | * | 8/2023 | Johnston | ................. H03F 3/195 307/149 |
| 12,045,071 B1 | * | 7/2024 | King | ...................... H01R 24/78 |
| 12,235,328 B1 | * | 2/2025 | Boledovic | ............ G01R 31/385 |
| 2004/0100791 A1 | * | 5/2004 | Bilotti | ...................... A45B 3/04 362/249.14 |
| 2006/0052905 A1 | * | 3/2006 | Pfingsten | ............. H05K 7/1471 323/295 |

(Continued)

*Primary Examiner* — Daniel Kessie
*Assistant Examiner* — Brian K Baxter
(74) *Attorney, Agent, or Firm* — Nicholas Makridakis

(57) ABSTRACT

An outdoor equipment with detachable functional components is internally provided with a control circuit board and a power accessory coupled to the control circuit board. An installation portion is provided on the outdoor equipment for detachable assembly of the functional components, the functional components is provided with several with different functions, and the functional components are coupled with the control circuit board through the installation portion for power supply and control of the functional components by the control circuit board. The control circuit board is coupled with an identification module and when the control circuit board is coupled with the functional components through the installation portion, the identification module is configured to identify the functional components and generate identity information to send to the control circuit board. The control circuit board is configured to recognize the identity information and call corresponding output power to supply power to the functional components.

9 Claims, 6 Drawing Sheets

(56)          References Cited

U.S. PATENT DOCUMENTS

| | | | | |
|---|---|---|---|---|
| 2006/0142744 | A1* | 6/2006 | Boutoussov | A61B 18/22 |
| | | | | 433/29 |
| 2007/0284845 | A1* | 12/2007 | Roovers | A61G 5/045 |
| | | | | 180/315 |
| 2008/0250570 | A1* | 10/2008 | Dayton | B25F 3/00 |
| | | | | 173/217 |
| 2010/0027247 | A1* | 2/2010 | Olsen | F21V 33/0092 |
| | | | | 362/183 |
| 2012/0151240 | A1* | 6/2012 | Robinson | H02J 7/00047 |
| | | | | 713/340 |
| 2014/0350722 | A1* | 11/2014 | Skrinde | B25J 11/0085 |
| | | | | 700/245 |
| 2015/0216273 | A1* | 8/2015 | Akin | H02J 50/12 |
| | | | | 29/890.033 |
| 2015/0377480 | A1* | 12/2015 | Mitchell | F21V 33/0096 |
| | | | | 362/96 |
| 2018/0102706 | A1* | 4/2018 | Gao | H02J 7/00714 |
| 2018/0208016 | A1* | 7/2018 | O'Brien | B60H 1/00207 |
| 2020/0107621 | A1* | 4/2020 | Sluder | A45C 13/28 |
| 2021/0408820 | A1* | 12/2021 | Koenen | B60P 1/435 |
| 2022/0224277 | A1* | 7/2022 | Bell | H02S 30/20 |
| 2023/0201727 | A1* | 6/2023 | Cragg | G06F 3/1446 |
| | | | | 463/46 |
| 2023/0259188 | A1* | 8/2023 | Lee | H02J 7/342 |
| | | | | 713/300 |
| 2023/0323628 | A1* | 10/2023 | Raffuzzi | E02F 9/264 |
| | | | | 37/195 |
| 2024/0041170 | A1* | 2/2024 | Ke | A45B 25/02 |

* cited by examiner

OUTDOOR EQUIPMENT WITH DETACHABLE FUNCTIONAL COMPONENTS

CROSS REFERENCE TO RELATED APPLICATION

This application claims priority to Chinese Patent Application No. 2024218607041, filed on Aug. 2, 2024, which is hereby incorporated by reference in its entirety.

TECHNICAL FIELD

The present application relates to the technical field of outdoor equipments, and specifically to an outdoor equipment with detachable functional components.

BACKGROUND

With the rise of outdoor activities, people's love for nature is becoming closer and closer, and the demand for various outdoor camping supplies is increasing day by day. For example, in the face of alternation of day and night, the outdoor camping often requires carrying light sets to achieve lighting functions. And in the face of hot summer, it is necessary to have a fan to achieve the function of cooling and blowing air. When powering small electronic devices, batteries and compatible interfaces are required. Therefore, currently there is a type of lighting fixture with batteries as the main body, on which various accessories with different functions are provided and these various accessories may be disassembled to meet the needs of people in different scenarios.

However, the above technologies often cannot achieve different power and gear switching for the various accessories, making it impossible to adjust the current or voltage input to the accessories. If the accessories consume too much power, such as in winter when a high speed fan is needed for snow blowing, a too small current or voltage may easily lead to low rotation speed of the high speed fan and low snow blowing efficiency. Alternatively, if the power consumption of the accessories is relatively low, such as in winter when hand warmer accessories are needed to keep warm, excessive current or voltage may easily cause the temperature of the hand warmer accessories to be too high, which may result in burns to the user or even cause the equipment to overheat and cause a fire.

SUMMARY

In view of the shortcomings and deficiencies of the existing technologies, the present disclosure aims to provide an outdoor equipment with detachable functional components, which can identify the functional components with different power consumption and control the input current or voltage of the functional components based on the identification information, improving the compatibility to the functional components with different power consumption and enhancing the advantages of user experience.

To achieve the above objectives, the present disclosure adopts the following technical solutions. In some embodiments of the present disclosure, an outdoor equipment with detachable functional components is provided. Herein the outdoor equipment is internally provided with a control circuit board and a power accessory coupled to the control circuit board. In addition, an installation portion is provided on the outdoor equipment for detachable assembly of the functional components, the functional components is provided with several with different functions, and the functional components are coupled with the control circuit board through the installation portion for power supply and control of the functional components by the control circuit board. The control circuit board is coupled with an identification module and when the control circuit board is coupled with the functional components through the installation portion, the identification module is configured to identify types of the functional components and generate identity information based on the types of the functional components to send to the control circuit board, and the control circuit board is configured to recognize the identity information and call corresponding output power to supply power to the functional components. The control circuit board is coupled with a control member for users to adjust the output power of the control circuit board to the functional components level by level, increasing or decreasing the output power of each level under different identity information is different, or the output power corresponding to at least one level under different identity information is different.

In some preferred embodiments of the present disclosure, the control member includes a plurality of buttons coupled to the control circuit board, and the buttons at least includes a gear adjustment button and a power switch button.

In some preferred embodiments of the present disclosure, the functional components includes a first functional component, the first functional component is provided with a button for the users to press to switch different usage modes, the identity information recognized and generated by the identification module varies under the different usage modes, and the control circuit board call different output powers to supply power to the first functional component when recognizing different identity information.

In some preferred embodiments of the present disclosure, the first functional component is a high speed fan, and the high speed fan has at least two usage modes with a wind speed under one usage mode is greater than that in another usage mode.

In some preferred embodiments of the present disclosure, the functional components includes a second functional component, the second functional component is provided with a plurality of buttons for the users to press to control a power switch of the second functional component, or switch usage modes of the second functional components, and the identity information recognized and generated by the identification module under different usage modes is the same.

In some preferred embodiments of the present disclosure, the second functional component at least includes an igniter, an inflation pump, or an alarm.

In some preferred embodiments of the present disclosure, a light emitting portion is provided on one end of the outdoor equipment away from the installation portion, the light emitting portion is provided with a light frame, a light source, and a lampshade, the light source is coupled with the control circuit board, and the lampshade is covered on the light frame and made of transparent material.

In some preferred embodiments of the present disclosure, the light source comprises a plurality of LED lights enclosed on the light frame, and all LED lights are arranged facing to a side of the lampshade.

In some preferred embodiments of the present disclosure, the light source comprises flashlight beads oriented towards a bottom of the lampshade.

In some preferred embodiments of the present disclosure, the identification module is configured to identify resistance information or electronic tag information of the functional components.

After adopting the above technical solutions, the outdoor equipment with detachable functional components of the present disclosure has at least the following beneficial effects.

1. By setting the control circuit board on the outdoor equipment and allow the control circuit board is coupled with the power accessory, and further setting the installation portion on the outdoor equipment for detachable assembly of the functional components, which can be coupled with the control circuit board. Moreover, setting the control member and the identification module on the control circuit board, the identification module can identify the types of the functional components and generate the identity information. Then the control circuit board outputs different power consumption to the functional components based on the identity information, thus using different output powers for different functional components to improve their compatibility.

2. The control member can be used for the users to adjust the output power of the control circuit board to the functional components level by level, increasing or decreasing the output power of each level under different identity information is different, or the output power corresponding to at least one level under different identity information is different. Therefore, after replacing different functional components, the control member can use gears that are adapted to the functional components for power output.

BRIEF DESCRIPTION OF THE DRAWINGS

To provide a clearer explanation of the technical solutions in the embodiments of the present disclosure or the existing technologies, a brief introduction will be given below to the accompanying drawings required for the description of the embodiments or the existing technologies. It is obvious that the accompanying drawings described below are only some embodiments of the present disclosure, for one of ordinary skill in the art, other drawings may be obtained based on these drawings without creative labor.

Figure 1:
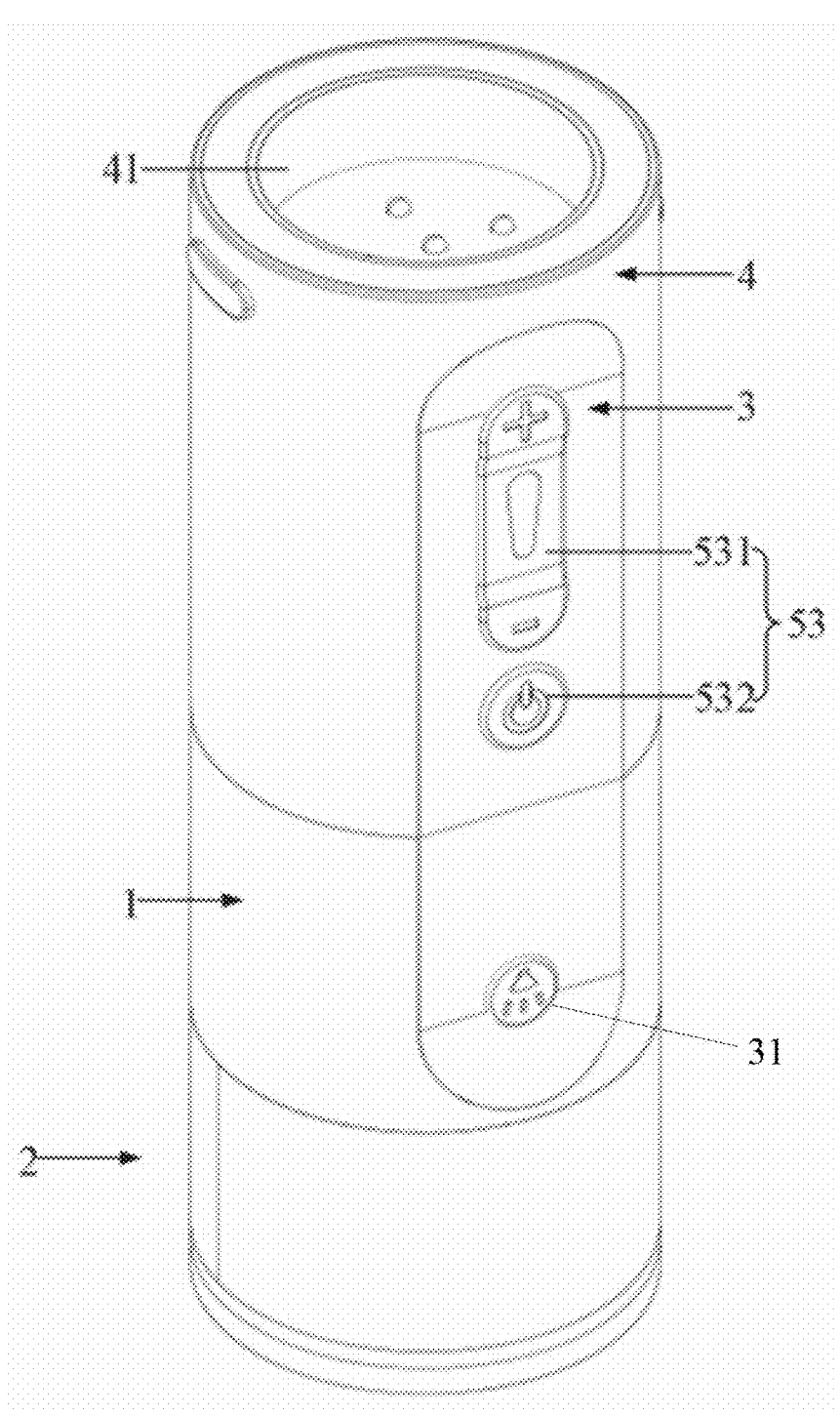
FIG. 1 shows a structural schematic diagram of an outdoor equipment with detachable functional components in accordance with some embodiments of the present disclosure.

In the drawings, reference signs are as follows. 10. Outdoor equipment, 1. Housing, 11. Exposed port, 12. Locating element, 2. Light emitting portion, 21. Light frame, 22. Light source, 23. Lampshade, 211. Inclined surface, 212. Horn shaped spotlight cover, 221. LED light, 222. Flashlight bead. 3. Control member, 31. Switch, 4. Installation portion, 41. Groove, 42. Conducting probe, 5. PCB board, 51.

Interface, 52. Identification module, 53. Button, 531. Gear adjustment button, 532. Power switch button, 6. Power accessory, 7. Control circuit board, 8. Functional component, 81. Conductive hole, 82. Key.

DETAILED DESCRIPTION OF THE EMBODIMENTS

The following will provide a further detailed explanation of the outdoor equipment with detachable functional components of the present disclosure in conjunction with the accompanying drawings.

The specific embodiments are only an explanation of the outdoor equipment with detachable functional components of the present disclosure and are not a limitation of the present invention. After reading this specification, one of ordinary skill in the art may make modifications to the embodiments as needed without any creative contribution, but as long as they are within the scope of the claims of the present disclosure, shall be protected by the patent law.

Figure 2:
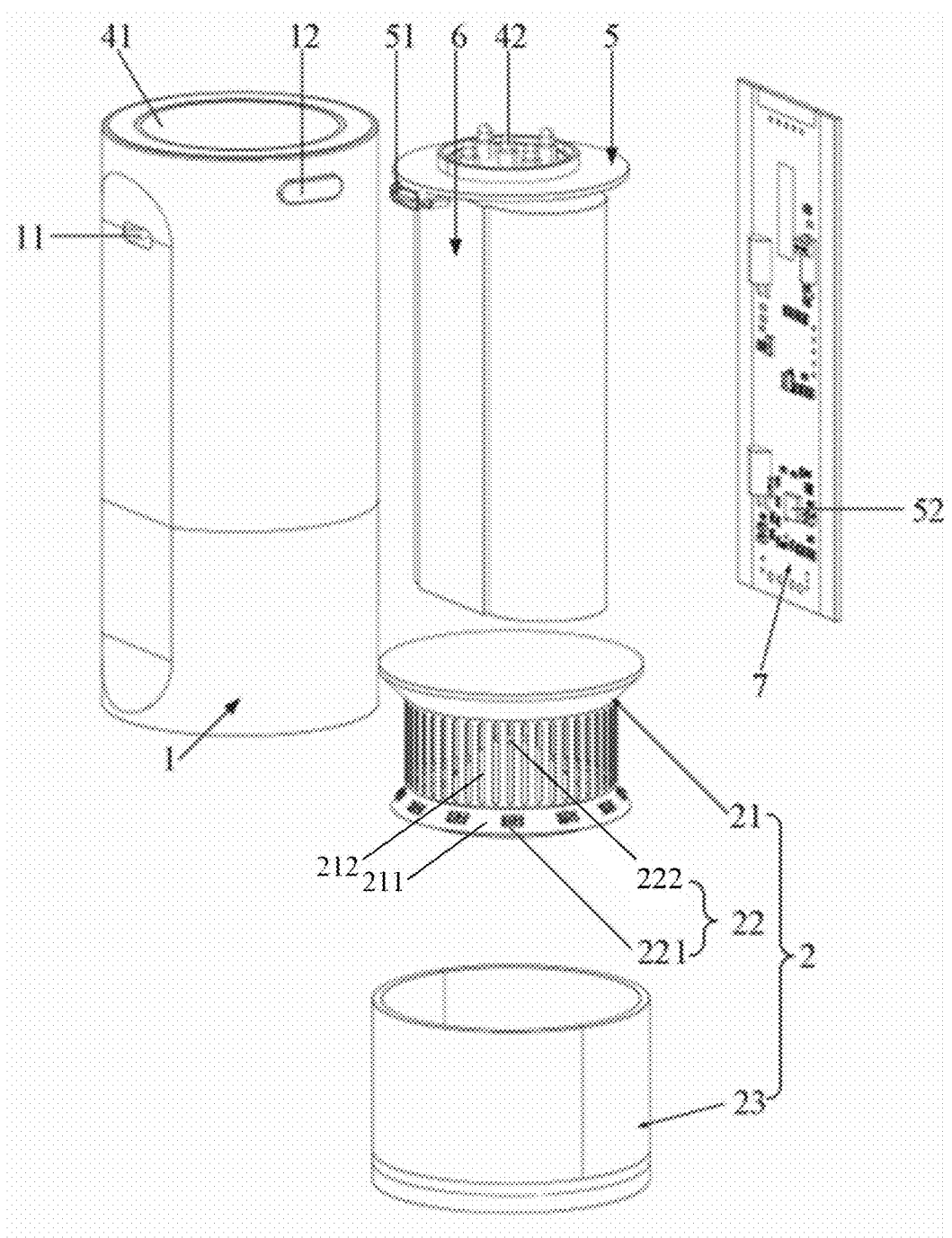
FIG. 2 shows an exploded view of FIG. 1.

In some embodiments of the present disclosure, an outdoor equipment 10 with detachable functional components is provided, as shown in FIG. 1 and FIG. 2, the outdoor equipment 10 includes a housing 1, a control circuit board 7 and a power accessory 6 are provided inside the housing 1. The power accessory 6 includes a rechargeable battery and a PCB board 5 coupled to the rechargeable battery and the PCB board 5 controls the charging and discharging of the power accessory 6. An exposed port 11 is installed on a surface of the housing 1, an interface 51 is coupled onto the PCB board 5 to pass through the exposed port 11, and the interface 51 is used by an external power source to charge the power accessory 6 through the PCB board 5. Moreover, the control circuit board 7 provided inside the housing 1 is coupled to the PCB board 5.

In some preferred embodiments of the present disclosure, the control circuit board 7 is coupled with a light emitting portion 2 and an installation portion 4, the light emitting portion 2 can emit light to provide illumination, while the installation portion 4 can be detachably equipped with functional components 8. The functional components 8 are provided with several and each functional component 8 with different functions. The installation portion 4 can install one or more functional components 8 at the same time. In some embodiments of the present disclosure, only one functional component 8 is installed simultaneously.

It should be noted that, the control circuit board 7 is coupled with a control member 3, and a portion of the control member 3 that a user can press is exposed on the housing 1 of the outdoor equipment 10. The control member 3 is provided with multiple buttons 53, including a gear adjustment button 531 and a power switch button 532. The gear adjustment button 531 is used by the user to press so that the control circuit board 4 can adjust the current or voltage input to the functional component 8 through the installation port 4. The power switch button 532 is provided with two, one of which can be pressed by the user so that the control circuit board 7 can control the opening or closing of the light emitting portion 2, and the other of which can be pressed by the user so that the control circuit board 7 can control the opening or closing of the functional component 8. In some embodiments of the present disclosure, the gear adjustment button 531 only supports gradually increasing the output power of the functional component 8. When the maximum output power is reached, the gear adjustment button 531 is pressed again to stop the operation of the functional component 8, or maintain the maximum output power to the functional component 8 for output.

In some preferred embodiments of the present disclosure, the control member 3 is provided with a power indicator, long press the power switch button 532 to display the remaining power of the power accessory 6. In some embodiments of the present disclosure, the display modes are as follows. Set 5 light-emitting lamp beads, the more the 5 light-emitting lamp beads light up, the more power they have. When fully charged, all the 5 light-emitting lamp beads light up. When the power is low, that is, when the power is less than 5%, only one of the light-emitting lamp beads flashes and the rest do not light up. In some other embodiments of the present disclosure, only set one light-emitting lamp bead, and when the light-emitting lamp bead lights up in different colors, it represents that the power accessory 6 is at different levels of power. For example, when the light-emitting lamp bead lights up green, it represents 70% or more of power. When the light-emitting lamp bead lights up yellow, it represents the power within a range of 21% to 69%. And when the light-emitting lamp bead lights up red, it represents the power is at or below 20% (Herein the power means electric quantity).

It should be noted that the plurality of light-emitting lamp beads can also serve as gear indicator lights. When the gear adjustment button 531 is adjusted to different gears, corresponding light-emitting lamp beads will light up.

In some preferred embodiments of the present disclosure, the installation portion 4 is provided with a groove 41 (that is it is provided on the top of the outdoor equipment 10). Correspondingly, the functional component 8 is equipped with a protrusion that can be inserted into the groove 41. On a side of the protrusion and a side of the groove 41, a detachable locating element 12 may be installed, which can be connected by magnetic blocks, hooks, or threads. A conducting probe 42 is provided on a bottom of the groove 41, and a conductive hole 81 for inserting the conducting probe 42 is correspondingly provided on the bottom of the protrusion. When the protrusion on the functional component 8 is inserted into the groove 41, the conducting probe 42 is also inserted into the conducting hole 81. At this time, the functional component 8 is coupled with the control circuit board 7 through the installation portion 4, and the control circuit board 7 can send the power from the power accessory 6 into the functional component 8. The locating element 12 may also be installed on the outer wall of the outdoor equipment 10. In this case, the functional component 8 is partially attached to the outer wall of the outdoor equipment 10, and the inner wall of the attached portion of the outdoor equipment 10 is also equipped with the locating element 12.

The two locating elements 12 work together to achieve the detachable assembly of the outdoor equipment 10 and the functional component 8.

In some other embodiments of the present disclosure, the conducting probe 42 may also be coupled with the PCB board 5, and then indirectly coupled with the control circuit board 7 via the PCB board 5.

Figure 3:
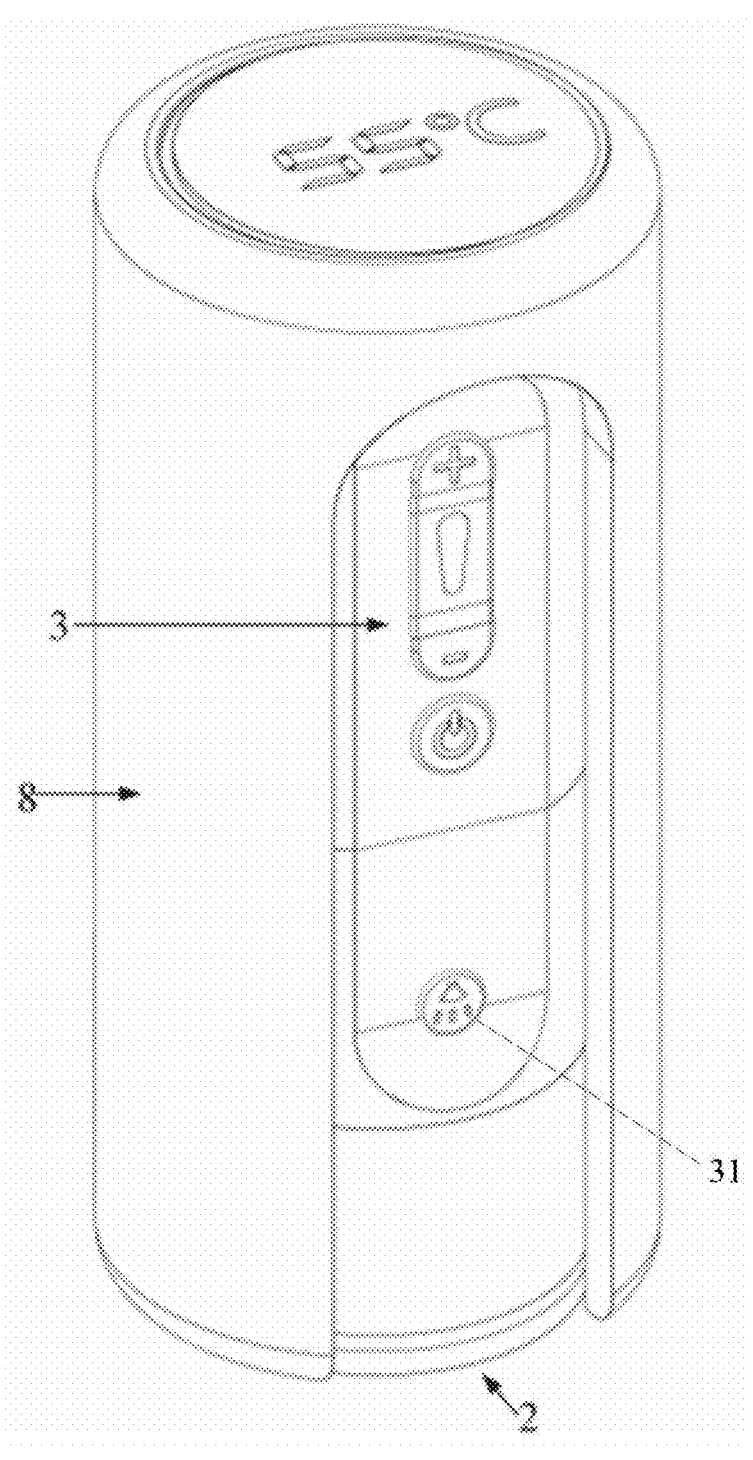
FIG. 3 shows a structural schematic diagram when a functional component is a hand warmer in accordance with some embodiments of the present disclosure.

Referring to FIG. 3, in some embodiments of the present disclosure, the functional component 8 is a hand warmer, which is covered on the housing 1 of the outdoor equipment 10. The hand warmer is engaged with a gap between the hand warmer and the outdoor equipment 10, and the locating element 12 is set between the two to prevent the assembled hand warmer from shaking with the outdoor equipment 10. After coupling the hand warmer with the outdoor equipment 10, the user can control the temperature of the hand warmer or the opening and closing of the hand warmer by pressing the control member 3 on the housing 1 of the outdoor equipment 10. In some embodiments of the present disclosure, a display is provided on an upper portion of the hand warmer, which can display a real-time temperature of the hand warmer.

Figure 4:
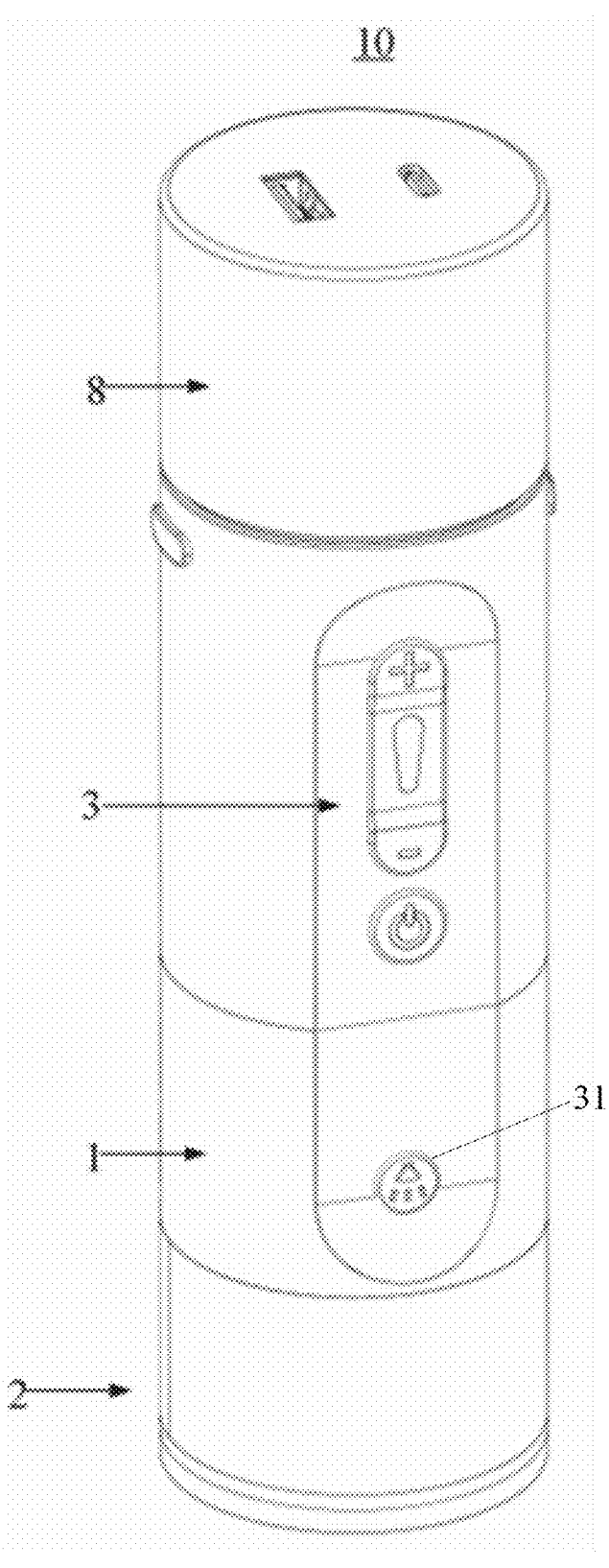
FIG. 4 shows a structural schematic diagram when the functional component is a charging stand in accordance with some embodiments of the present disclosure.

Referring to FIG. 4, in some embodiments of the present disclosure, the functional component 8 is a charging stand, and a bottom of the charging stand is detachably assembled with the installation port 4. After installation with the installation port 4, the charging stand can be powered from the power accessory 6. A plurality of charging interfaces with different specifications are provided on a top of the charging stand, which can be used to charge external electronic devices through the power accessory 6 in the outdoor equipment 10. The external electronic devices may include mobile phones or headphone compartments.

Figure 5:
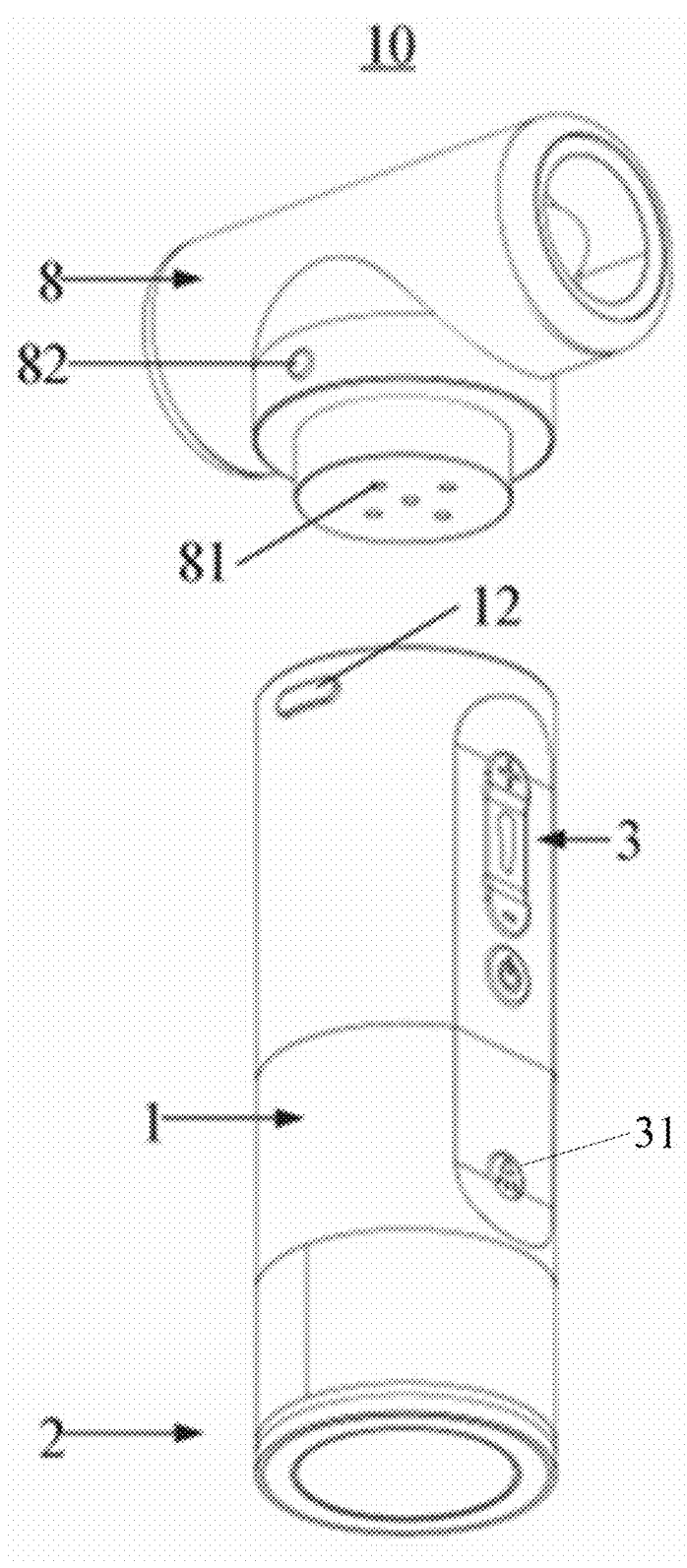
FIG. 5 shows a disassembly schematic diagram when the functional component is a high speed fan in accordance with some embodiments of the present disclosure.

Referring to FIG. 5, in some embodiments of the present disclosure, the functional component 8 is a high speed fan, which shows a schematic diagram of the high speed fan in a disassembled state. When the protrusion on a bottom of the high speed fan is embedded in the groove 41, the high speed fan is coupled with the outdoor equipment 10, and the outdoor equipment 10 can be provide power to the high speed fan. At this time, the high speed fan can be controlled by the gear adjustment button 531, and the wind speed of the high speed fan varies at different gears. Therefore, the wind speed adjustment of the high speed fan can be achieved through the control member 3 on the outdoor equipment 10.

In some preferred embodiments of the present disclosure, the high speed fan is provided with a key 82, which can be pressed by the user to switch the usage mode of the high speed fan. There are at least two usage modes, and one of the two usage modes has a higher wind speed than that in the other usage mode, thus increasing a range of wind speeds that the high speed fan can adjust.

Specifically, the high speed fan has two usage modes, one of which is a low-speed mode and the other is a high-speed mode. When the high speed fan is in either usage mode, the user can adjust the gear of the high speed fan through the gear adjustment button 531.

It should be noted that the wind speed of the high speed fan varies depending on the gear in different usage modes. Therefore, the high speed fan actually has two sets of adjustable wind speed gears, which can meet the needs of various scenarios.

Figure 6:
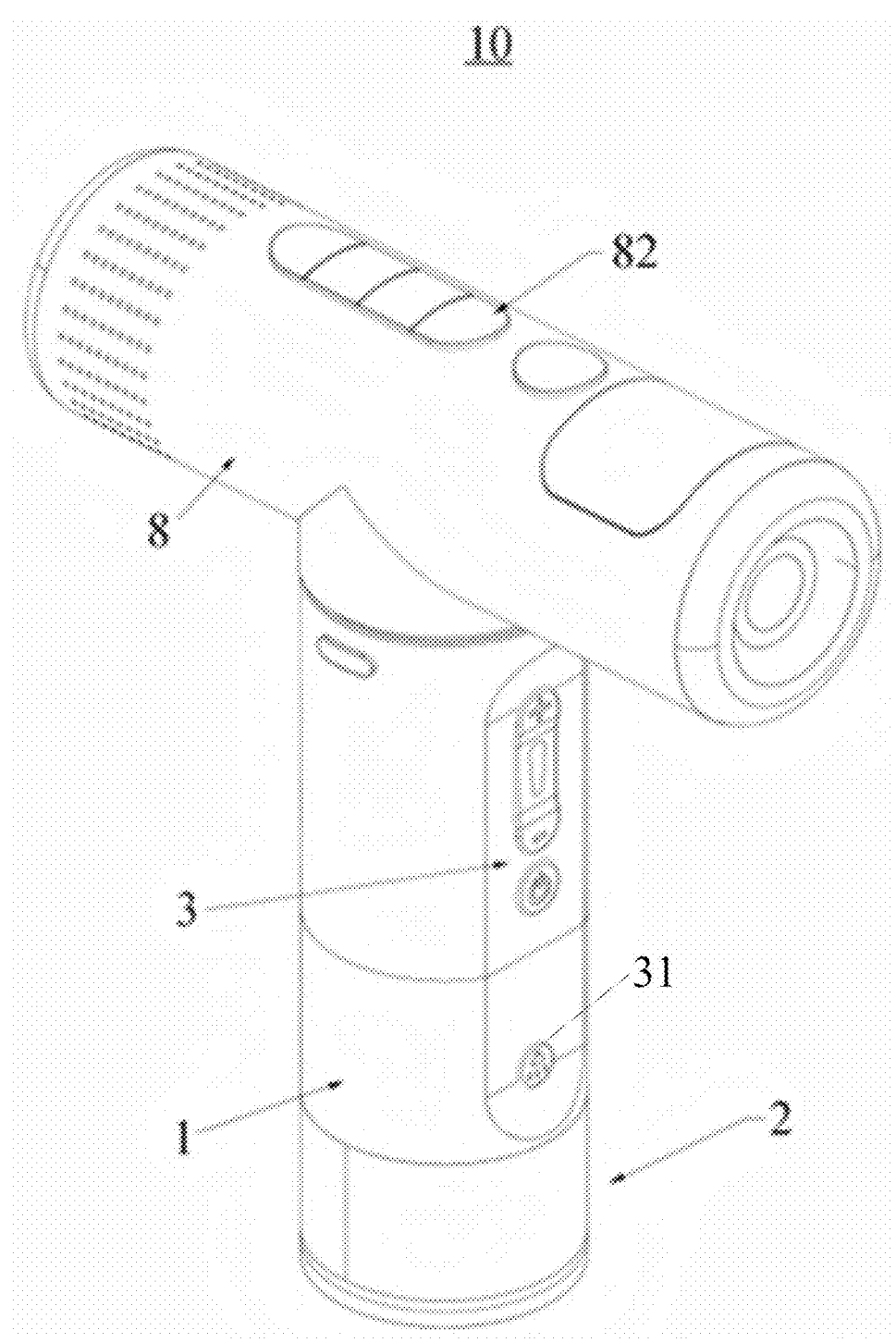
FIG. 6 shows a structural schematic diagram when the functional component is inflation pump in accordance with some embodiments of the present disclosure.

Referring to FIG. 6, in some embodiments of the present disclosure, the functional component 8 is an inflation pump. The inflation pump is provided with a plurality of keys 82, one of the buttons controls the opening and closing of the inflation pump, which other buttons 82 can switch the inflation modes of the inflation pump. Specifically, the inflation modes of the inflation pump include a bicycle tire inflation mode, a sedan inflation mode, a balloon inflation mode, and a truck inflation mode. Different inflation modes have different single inflation times or different airflow velocities blown out by the inflation pump.

In some other embodiments of the present disclosure, the functional component 8 is an alarm module, which includes an ultrasonic generator that can expel nearby organisms sensitive to ultrasonic waves, as well as an infrared sensing alarm that can emit a buzzing sound and flash light to expel nearby organisms when it is detected. It can also be used as a warning signal to remind the user that nearby organisms are approaching. The alarm module is provided with several keys 82, one of which can reset the alarm module when the buzzing sound and flashing light are emitted. And the other keys 82 can also be used to control one or two of the ultrasonic generator and infrared sensing alarm on the alarm module to turn on or off.

In some other embodiments of the present disclosure, the functional component 8 may be an igniter, which can be powered from the power accessory 6 in the outdoor equipment 10. By pressing the key 82 on the igniter, it can be turned on and off.

In some other embodiments of the present disclosure, the functional components 8 include but are not limited to tools such as water pumps, lighting fixtures, or ceiling fans. The water pumps and the ceiling fans can be adjusted the gears by using the gear adjustment button 531 on the control member 3, that is, the flow rate of the water pumps and the speed of the ceiling fans can be controlled. The light fixtures can be adjusted for brightness by using the gear adjustment button 531 on the control member 3. The key 82 can also be set on the light fixtures to adjust the lighting modes of the light fixtures, which can be white light, warm light, or soft light. Alternatively, the key 82 can adjust the flashing modes of the light fixtures, which can be a short flashing mode, a long flashing mode, or a constant light mode.

In some preferred embodiments of the present disclosure, referring to FIG. 2, the light emitting portion 2 is set at one end of the outdoor equipment 10 away from the installation portion 4, that is, the light emitting portion 2 is set at a lower portion of the outdoor equipment 10, and the installation portion 4 is set on the upper portion of the outdoor equipment 10. The light emitting portion 2 includes a light frame 21, a light source 22 and a lampshade 23. The light frame 21 is assembled with the inner wall of the housing 1 of the outdoor equipment 10 to achieve the light frame 21 be fixed, and the light frame 21 is provided with the light source 22 coupled with the control circuit board 7 for the user to control the opening and closing of the light source 22 through the control member 3. The lampshade 23 is made of transparent material and covers on the light frame 21, to allow the light emitted by the light source 22 on the light frame 21 to pass through the lampshade 23, thus the lampshade 23 plays a role to protect the light source 22 and the light frame 21.

It should be noted that the light frame 21 is hollow and has a circle of inclined surface 211 at the bottom, with the diameter of the inclined surface 211 increasing step by step from top to bottom. The light source 22 includes LED lights 221 and flashlight beads 222, the LED lights 221 are evenly distributed on the outer surface of the inclined surface 211. The light emitted by the LED lights 221 passes through the side of the lampshade 23, preferably the side of the lampshade 23 is made of semi-transparent material to make the light softer when passing through the lampshade 23.

It should be noted that the light frame 21 has a hollow structure and is provided with a horn shaped spotlight cover 212 inside, with a larger end of the horn shaped spotlight cover 212 facing away from the installation portion 4. A smaller end of the horn shaped spotlight cover 212 is provided with the flashlight beads 222. And the bottom of the lampshade 23 is made of transparent material for flashlight light to pass through the bottom of the lampshade 23 and be emitted.

In some embodiments of the present disclosure, the flashlight beads 222 are coupled with the control circuit board 7, and the LED lights 221 are also coupled with the control circuit board 7. The control member 3 is also provided with a switch 31 only controlling the light source 22, by pressing this switch 31, the LED lights 221 or the flashlight beads can be controlled to only turn on one, or both to turn on or off.

In some preferred embodiments of the present disclosure, the control circuit board 7 is coupled with an identification module 52. When the control circuit board 7 is coupled with the functional components 8 through the installation portion 4, the identification module 52 identify the types of the functional components 8 and generate identity information based on the types of the functional components 8, and then send to the control circuit board 7. The control circuit board 7 is also coupled with a storage module, which stores multiple output policies corresponding to different identity information, so as to match the stored output policies with the identity information received by the control circuit board 7. After completion of the match, the control circuit board 7 calls output policies of corresponding identity information to output power for the functional components 8. Thus, the functional components 8 with different power consumption can be operated normally. For example, it can prevent the input current or voltage of the high speed fan from being too low compared to its actual required current or voltage, which cause the speed of the high speed fan to be too low. And it also can prevent the temperature of the hand warmer from being too high due to excessive input current or voltage, thereby improving the compatibility of the functional components 8 with different power consumption and also enhancing actual experiences of the user.

In some preferred embodiments of the present disclosure, the control circuit board 7 is coupled with the gear adjustment button 531, which allows the user to adjust the output power of the control circuit board 7 to the functional components 8 level by level. And under different identity information, the output power of each level of the gear adjustment button 531 increases or decreases differently. For example, under some identity information, the adjustable output power of the gear adjustment button 531 is 1 W, 2 W, 3 W, 4 W, or 5 W. While under the other identity information, the adjustable output power of the gear adjustment button 531 is 1 W, 3 W, 5 W, 7 W, or 9 W, that is, the step value of the output power under different identity information is different.

It should be noted that the output power corresponding to at least one level under different identity information is different. For example, in some identity information, the adjustable output power of the gear adjustment button 531 is 1 W, 2 W, 3 W, 4 W, or 5 W. While in other identity information, the adjustable output power of the gear adjustment button 531 is 3 W, 4 W, 5 W, 6 W, or 7 W. That is, under such two different identity information, although some of the adjustable output powers of the gear adjustment button 531 are the same or overlap, there are still some different adjustable output powers.

In some preferred embodiments of the present disclosure, the identification module 52 is configured to identify the resistance information of the functional components 8, that is, the identification object of the identification module 52 is the resistance of the functional components 8. Alternatively, the identification module 52 is configured to identify the electronic tag information of the functional components 8, that is, the identity information. At this time, the identification object of the identification module 52 is NFC tags on the functional components 8.

The identification module 52 may be a component such as a microcontroller or MCU chip that can recognize the resistance or electronic tag information of the functional component 8. The microcontroller has multiple different preset resistance values or multiple various preset electronic tag information which are pre entered, and the multiple different preset resistance values correspond to multiple different functional components 8, as well as the multiple various preset electronic tag information correspond to the multiple different functional components 8. Moreover, the electronic tag information can be the name of the functional component 8, the resistance value of the functional component 8, and other information that can identify the types of the functional component 8.

When identifying the functional component 8 through the resistance, the functional component 8 is installed on the installation portion 4, and the microcontroller is electrically connected to the functional component 8. The microcontroller compares the resistance value of the current functional component 8 with the multiple preset resistance values until it matches one corresponding preset resistance value, then the output power corresponding to the resistance value is called to supply power to the current functional component 8. For example, when four different preset resistance values are entered in advance (corresponding to the resistance values of the hand warmer, the charging stand, the igniter, and the inflation pump). And when the current functional component 8 is the charging stand, the microcontroller compares the resistance value of the charging stand with the four preset resistance values until the resistance value of the current functional component 8 matches the preset resistance value of the charging stand, and then calls the output power of the corresponding charging stand to supply power to the charging stand.

Similarly, when identifying the functional component 8 through the electronic tag information, the functional component 8 is installed on the installation portion 4, and the microcontroller is electrically connected to the functional component 8. The microcontroller compares the electronic tag information of the current functional component 8 with the multiple preset electronic tag information until the electronic tag information of the current functional component 8 matches the corresponding preset electronic tag information, and then calls the output power corresponding to the electronic tag information to supply power to the current function component 8. For example, when the four different electronic tag information are pre-entered (corresponding to the names of the hand warmer, the charging stand, the igniter, and the inflation pump), and when the current functional component 8 is the hand warmer, the microcontroller compares the name of the hand warmer with the four preset names until the name of the current functional component 8 matches the name of the preset hand warmer, and then calls the output power of the corresponding hand warmer to supply power to the hand warmer.

In some preferred embodiments of the present disclosure, according to the classification of the keys 82 on the functional components 8 described above, the functional components 8 are divided into a first functional component and a second functional component. The first functional component has at least two sets of identity information and can switch identity information through the key 82 set thereon, so that the outdoor equipment 10 can call different output powers to supply power to the first functional component. The second functional component only has one set of identity information and can switch its mode or control the switch through the key 82 set thereon.

Specifically, the first functional component is the high speed fan described above, which has two sets of identity information corresponding to the high speed mode and the low speed mode. By pressing the key 82 set on the high speed fan, the identity information of the high speed fan can be switched, that is, the resistance value or the NFC tag that can be recognized by the identification module 52 can be changed. The second functional component is the igniter, the inflation pump or the alarm described above. By pressing the key 82 set on the igniter, which only allow the igniter start to work. Or by pressing the key 82 on the inflation pump or the alarm, which only allow the inflation pump or the alarm to switch a built-in mode or switch thereof.

The foregoing is only used to illustrate the technical solutions of the present disclosure and not to limit it. Any other modifications or equivalent substitutions made by one of ordinary skill in the art to the technical solutions of the present disclosure, as long as they do not depart from the concept and scope of the technical solutions of the present disclosure, shall be included in the scope of the claims of the present disclosure.

What is claimed is:

1. An outdoor equipment with detachable functional components, internally provided with a control circuit board and a power accessory coupled to the control circuit board; and
    wherein an installation portion is provided on the outdoor equipment for detachable assembly of the functional components, the functional components is provided with several with different functions, and the functional components are coupled with the control circuit board through the installation portion for power supply and control of the functional components by the control circuit board;
    wherein the control circuit board is coupled with an identification module and when the control circuit board is coupled with the functional components through the installation portion, the identification module is configured to identify the functional components and generate identity information to send to the control circuit board; the control circuit board is further coupled with a storage module that stores multiple output policies corresponding to different identity information, the control circuit board is configured to match stored output policies with the identity information received; and after completion of the match, the control circuit board is configured to call output policies of corresponding identity information to supply power to the functional components;
    wherein the control circuit board is coupled with a control member for users to adjust the output power of the control circuit board to the functional components level by level, increasing or decreasing the output power of each level under different identity information is different, or the output power corresponding to at least one level under different identity information is different; and
    wherein a light emitting portion is provided on one end of the outdoor equipment away from the installation portion, the light emitting portion is provided with a light frame, a light source, and a lampshade; the light frame is used for installing the light source, the light source is coupled with the control circuit board, and the lampshade is covered on the light frame and made of transparent material;
    wherein the light source comprises LED lights and flashlight beads, the light frame has a hollow structure and a circle of inclined surface is arranged at its bottom, a diameter of the inclined surface is configured to increase step by step from top to bottom, the LED lights are evenly distributed on an outer surface of the inclined surface, and light emitted by the LED lights passes through a side of the lampshade; and wherein a horn shaped spotlight cover is provided inside of the hollow structure of the light frame, with a larger end of the horn spotlight cover facing away from the installation portion and s smaller end of the horn spotlight cover being provided with the flashlight beads; a bottom of the lampshade is made of transparent material for light of the flashlight beads to pass through the bottom of the lampshade and be emitted; and wherein the LED lights and the flashlight beads are respectively coupled to the control circuit board, the control member is provided with a switch for controlling the light source, and the switch is configured to turn on or off of the LED lights or the flashlight beads, or to simultaneously turn on or off of the LED lights and the flashlight beads.

2. The outdoor equipment with detachable functional components according to claim 1, wherein the control member comprises a plurality of buttons coupled to the control circuit board, and the buttons at least comprises a gear adjustment button and a power switch button.

3. The outdoor equipment with detachable functional components according to claim 1, wherein the functional components comprises a first functional component, the first functional component is provided with a button for the users to press to switch different usage modes, the identity information recognized and generated by the identification module varies under the different usage modes, and the control circuit board call different output powers to supply power to the first functional component when recognizing different identity information.

4. The outdoor equipment with detachable functional components according to claim 3, wherein the first functional component is a high speed fan, and the high speed fan has at least two usage modes with a wind speed under one usage mode is greater than that in another usage mode.

5. The outdoor equipment with detachable functional components according to claim 1, wherein the functional components comprises a second functional component, the second functional component is provided with a plurality of buttons for the users to press to control a power switch of the second functional component, or switch usage modes of the second functional components, and the identity information recognized and generated by the identification module under different usage modes is the same.

6. The outdoor equipment with detachable functional components according to claim 5, wherein the second functional component comprises an igniter, an inflation pump, or an alarm.

7. The outdoor equipment with detachable functional components according to claim 1, wherein the light source comprises a plurality of LED lights enclosed on the light frame, and all LED lights are arranged facing to a side of the lampshade.

8. The outdoor equipment with detachable functional components according to claim 1, wherein the light source comprises flashlight beads oriented towards a bottom of the lampshade.

9. The outdoor equipment with detachable functional components according to claim 1, wherein the identification module is configured to identify resistance information or electronic tag information of the functional components.

* * * * *